United States Patent
Yamagishi

(10) Patent No.: US 10,970,166 B2
(45) Date of Patent: Apr. 6, 2021

(54) MEMORY SYSTEM AND METHOD OF CONTROLLING NON-VOLATILE MEMORY

(71) Applicant: TOSHIBA MEMORY CORPORATION, Minato-ku (JP)

(72) Inventor: Toshiyuki Yamagishi, Fuchu (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

(21) Appl. No.: 16/522,713

(22) Filed: Jul. 26, 2019

(65) Prior Publication Data
US 2020/0264951 A1    Aug. 20, 2020

(30) Foreign Application Priority Data

Feb. 19, 2019   (JP) .............................. JP2019-027796

(51) Int. Cl.
*G06F 11/10* (2006.01)
*H03M 13/29* (2006.01)
*G11C 29/52* (2006.01)

(52) U.S. Cl.
CPC .......... *G06F 11/1068* (2013.01); *G11C 29/52* (2013.01); *H03M 13/2906* (2013.01)

(58) Field of Classification Search
CPC . G11C 29/52; H03M 13/2906; G06F 11/1068
See application file for complete search history.

(56) References Cited

U.S. PATENT DOCUMENTS

| | | | |
|---|---|---|---|
| 5,923,680 A * | 7/1999 | Brueckheimer | ...... H04L 1/0057 714/758 |
| 6,546,518 B1 | 4/2003 | Leung et al. | |
| 8,996,947 B2 | 3/2015 | Chung et al. | |
| 9,191,256 B2 | 11/2015 | Vojcic et al. | |
| 9,761,325 B1 * | 9/2017 | Shi | ........................ G11C 29/021 |
| 9,971,626 B2 | 5/2018 | Busaba et al. | |
| 10,719,395 B2 * | 7/2020 | Hara | ................. H03M 13/2906 |
| 2008/0002854 A1 * | 1/2008 | Tehranchi | ............. G10L 19/018 382/100 |
| 2017/0262379 A1 | 9/2017 | Hara et al. | |

FOREIGN PATENT DOCUMENTS

JP        2001-24519 A    1/2001

\* cited by examiner

*Primary Examiner* — Guy L Lamarre
(74) *Attorney, Agent, or Firm* — Oblon, McClelland, Maier & Neustadt, L.L.P.

(57) ABSTRACT

A memory system of an embodiment includes a memory controller and a non-volatile memory. The memory controller executes error correction encoding on user data received from a host to generate first encoded data, adds the first encoded data to each of one or more pieces of second encoded data, obtained by performing error correction encoding on each of one or more pieces of predetermined data, to generate one or more pieces of third encoded data, obtained by executing error mitigation encoding on the first encoded data, and selects any one piece of encoded data from the first encoded data and the one or more pieces of third encoded data. The non-volatile memory stores the selected encoded data.

20 Claims, 8 Drawing Sheets

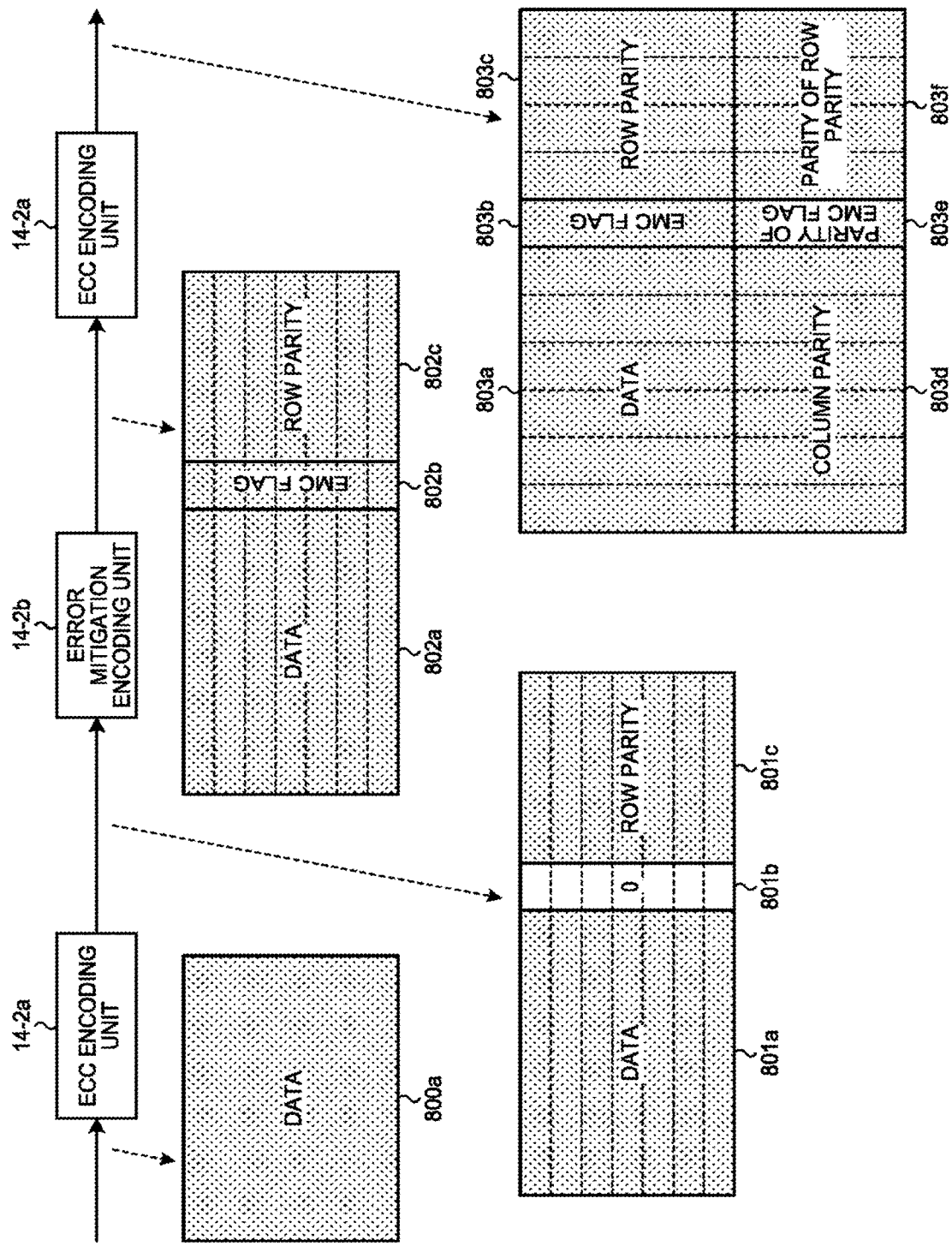

US 10,970,166 B2

MEMORY SYSTEM AND METHOD OF CONTROLLING NON-VOLATILE MEMORY

CROSS-REFERENCE TO RELATED APPLICATIONS

This application is based upon and claims the benefit of priority from Japanese Patent Application No. 2019-027796, filed on Feb. 19, 2019; the entire contents of which are incorporated herein by reference.

FIELD

Embodiments described herein relate genera a memory system.

BACKGROUND

In recent years, the degree of integration of the storage density have increased in storage devices, whereas reliability of one storage element has decreased. In order to maintain practical reliability, many storage devices employ an error correction code (ECC). In the case of a storage element whose reliability changes depending on a pattern of stored information, conversion is sometimes further executed so as to make a pattern less likely to cause an error during writing. Such conversion is called an error mitigation code (ENC) or a constrained code. The error mitigation code can reduce the number of errors, but is generally used together with the error correction code since it is difficult to ensure practical reliability only with the error mitigation code.

BRIEF DESCRIPTION OF THE DRAWINGS

FIG. 8 is a diagram for describing flow of an encoding process of the second embodiment.

DETAILED DESCRIPTION

A memory system of an embodiment includes a memory controller and a non-volatile memory. The memory controller executes error correction encoding on user data received from a host to generate first encoded data, adds the first encoded data to each of one or more pieces of second encoded data, obtained by performing error correction encoding on each of one or more pieces of predetermined data, to generate one or more pieces of third encoded data, obtained by executing error mitigation encoding on the first encoded data, and selects any one piece of encoded data from the first encoded data and the one or more pieces of third encoded data. The non-volatile memory stores the selected encoded data.

Hereinafter, a memory system according to the embodiment will be described in detail below with reference to the attached drawings. Incidentally, the present invention is not limited to the following embodiment.

Hereinafter, it is assumed that the error correction code is a systematic code in which data to be encoded can be clearly distinguished from a redundant part (ECC parity) obtained by the error correction code. Similarly, the error mitigation code is a systematic code in which data to be encoded can be clearly distinguished from a redundant part (EMC flag) obtained by the error mitigation code.

Such error mitigation codes include, for example, asymmetric coding. In the asymmetric coding, when it is determined, based on the numbers of 0 and 1 in a bit sequence of data, that inverting these bits (bit flipping) causes fewer errors, the bits of data are inverted, and information indicating that the bits have been inverted (for example, 1) is written to the EMC flag. Further, when it is determined that errors are reduced in the case of not inverting the bits, the hits of data are not inverted, and information indicating that the bits are not inverted (for example, 0) is written in the EMC flag. The inversion of bits is realized, for example, by calculating exclusive CR with bits having a value of "1" for each bit.

In this manner, the EMC flag is information for identifying processing that has been performed in the error mitigation encoding. As described above, for example, "1" or "0" is set in the EMC flag depending on whether or not the bit has been inverted in the asymmetric coding. Incidentally, a method for setting the EMC flag is not limited thereto, and may be changed according to an error correction code to be applied.

First Embodiment

Figure 1:
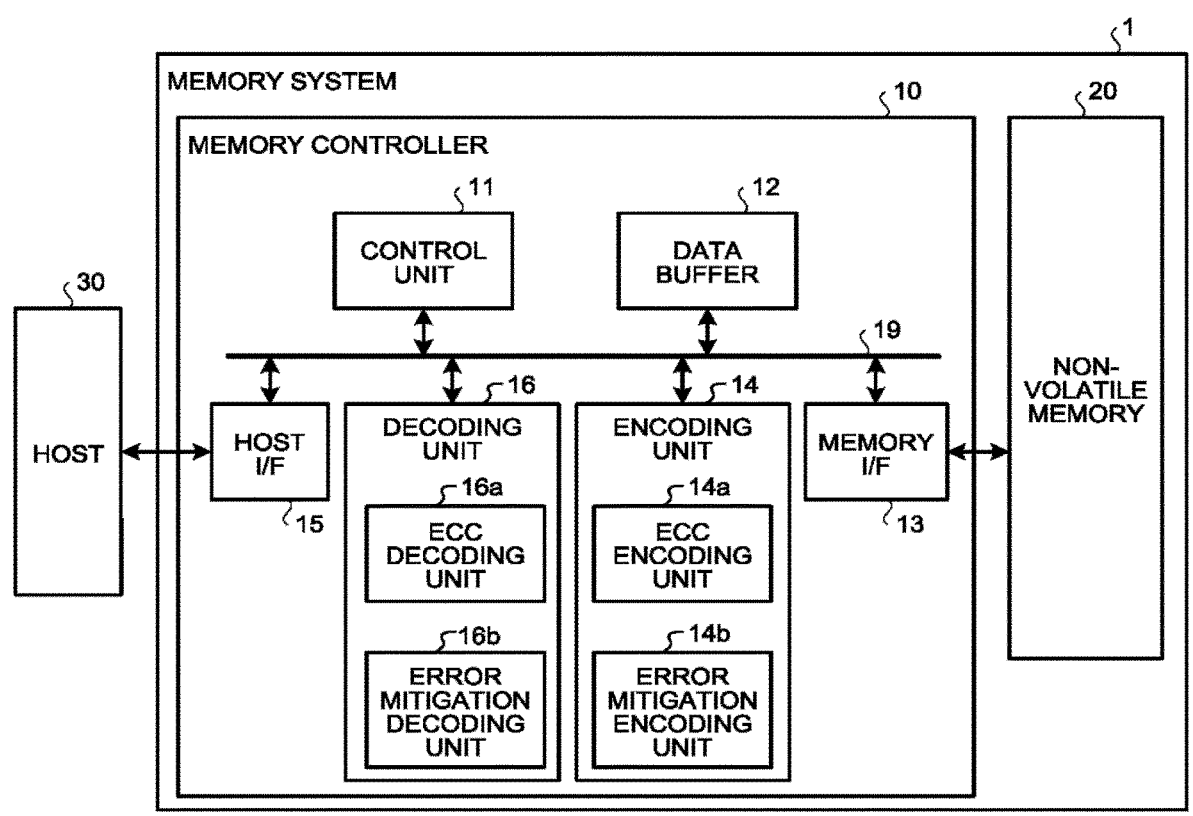
FIG. 1 is a block diagram illustrating a schematic configuration example of a memory system according to a first embodiment.

First, a memory system according to the present embodiment will be described in detail with reference to the drawings. FIG. 1 is a block diagram illustrating a schematic configuration example of the memory system according to the present embodiment. As illustrated in FIG. 1, the memory system 1 includes a memory controller 10 and a non-volatile memory 20. The memory system 1 is capable of being connected with a host 30, and FIG. 1 illustrates a state where the memory system 1 is connected with the host 30. The host 30 may be electronic equipment, for example, a personal computer, a mobile phone, or the like.

The non-volatile memory 20 is a non-volatile memory that stores data in a non-volatile manner, and is, for example, a NAND flash memory (hereinafter simply referred to as a NAND memory). Although the following description exemplifies a case where a NAND memory is used as the non-volatile memory 20, a storage device other than the NAND memory, such as a three-dimensional structure flash memory, a resistive random access memory (ReRAM), or a ferroelectric random access memory (FeRAM), as the non-volatile memory 20. Further, it is not essential that the non-volatile memory 20 be a semiconductor memory, and the present embodiment can be also applied to various storage media other than the semiconductor memory.

The memory system 1 may be various memory systems including the non-volatile memory 20 such as a so-called solid state drive (SSD) or a memory card or the like in which the memory controller 10 and the non-volatile memory 20 are configured as a single package.

The memory controller 10 controls write to the non-volatile memory 20 according to a write request from the host 30. Further, the memory controller 10 controls read from the non-volatile memory 20 according to a read request from the host 30. The memory controller 10 is a semiconductor integrated circuit configured as, for example, a SoC (System On a Chip). The memory controller 10 includes a host interface (host I/F) 15, a memory interface (memory I/F) 13, a control unit 11, an encoding unit 14, a decoding unit 16, and a data buffer 12. The host I/F 15, the memory I/F 13, the control unit 11, the encoding unit 14, the decoding unit 16, and the data buffer 12 are mutually connected via an internal bus 19. Some or all of operations of the respective components of the memory controller 10 to be described below may be realized by firmware executed by a central processing unit (CPU), or may be realized by hardware.

The host I/F 15 executes a process according to the interface standard with the host 30, and outputs a command, user data to be written, and the like received from the host 30 to the internal bus 19. Further, the host I/F 15 transmits the user data that has been read from the non-volatile memory 20 and restored, a response from the control unit 11, and the like to the host 30.

The memory I/F 13 performs a write process to the non-volatile memory 20 based on an instruction of the control unit 11. Further, the memory I/F 13 performs a read process from the non-volatile memory 20 based on an instruction of the control unit 11.

The data buffer 12 temporarily stores the user data until the memory controller 10 stores the user data received from the host 30 the non-volatile memory 20. Further, the data buffer 12 temporarily stores the user data read from the non-volatile memory 20 until being transmitted to the host 30. As the data buffer 12, it is possible to use a general-purpose memory, for example, a static random access memory (SRAM), a dynamic random access memory (DRAM), or the like. Incidentally, the data buffer 12 may be mounted outside the memory controller 10 without being built in the memory controller 10.

The control unit 11 comprehensively controls various components of the memory system 1. In the case of receiving a command from the host 30 via the host I/F 15, the control unit 11 performs control according to the command. For example, the control unit 11 instructs the memory I/F 13 to write the user data and parity to the non-volatile memory 20 according to the command from the host 30. For example, the control unit 11 instructs the memory I/F 13 to read the user data and parity from the non-volatile memory 20 according to the command from the host 30.

Further, in the case of receiving the write request of the user data from the host 30, the control unit 11 determines a storage area (memory area) on the non-volatile memory 20 with respect to the user data to be accumulated in the data buffer 12. That is, the control unit 11 manages a write destination of the user data. An association between a logical address of the user data received from the host 30, and a physical address that indicates the storage area on the non-volatile memory 20 in which the user data is stored, is stored as an address conversion table.

Further, in the case of receiving the read request from the host 30, the control unit 11 converts the logical address designated by the read request into the physical address using the above-described address conversion table, and instructs the memory I/F 13 to perform reading from the physical address.

In the NAND memory, the write and the read are generally performed in a data unit of a so-called page, and erase is performed in a data unit of a so-called block. In the embodiment, a plurality of memory cells to be connected to the same word line are referred to as a memory cell group. When the memory cell is a single level cell (SLC), one memory cell group corresponds to one page. When the memory cell is a multiple level cell (MLC), one memory cell group corresponds to a plurality of pages. Incidentally, the PLC in the present description includes a triple level cell (TLC) that stores t bits in one memory cell, a quad level cell (QLC) that stores 4 bits in one memory cell, and the like. Further, each memory cell is connected not only to the word line, but also to a bit line. Therefore, each memory cell can be identified by an address that identifies the word line, and an address that identifies the bit line.

The user data transmitted from the host 30 is transferred to the internal bus 19 and stored in the data buffer 12.

The encoding unit 14 encodes user data stored in the non-volatile memory 20 to generate a code word. The encoding unit 14 includes an ECC encoding unit 14a and an error mitigation encoding unit 14b. Incidentally, the data to be encoded by the encoding unit 14 may include control data and the like to be used in the memory controller 10 in addition to the user data.

The ECC encoding unit 14a performs error correction encoding on the user data stored in the non-volatile memory 20. The error mitigation encoding unit 14b performs error mitigation encoding on the data that has been subjected to error correction encoding.

The error mitigation encoding is a process of giving a deviation to a threshold voltage of a memory cell by converting data to be written. Accordingly, cells to be programmed to a threshold voltage, which has bad properties in terms of cell exhaustion and a bit error rate (BER), can be reduced, and cells to be programmed to a threshold voltage having good properties can be increased. The cell exhaustion means an inter-cell interference effect, and exhaustion of memory cells due to write and erase.

For example, the cell exhaustion and PER properties tend to be worse as the threshold voltage is higher in some cases. In such a case, the error mitigation encoding unit 14b performs error mitigation encoding so as to lower an occurrence probability P (Vth) of a memory cell with a high threshold voltage and to increase an occurrence probability P (Vth) of a memory cell with a low threshold voltage.

The decoding unit 16 decodes reception word read from the non-volatile memory 20 to restore the user data. The decoding unit 16 includes an ECC decoding unit 16a and an error mitigation decoding unit 16b.

The ECC decoding unit 16a performs error correction decoding on the reception word read from the non-volatile memory 20. The error mitigation decoding unit 16b performs error mitigation decoding on the data that has been subjected to the error correction decoding.

Next, a write process to the non-volatile memory 20 according to the present embodiment will be described. The control unit 11 instructs the encoding unit 14 to encode user data at the time of writing to the non-volatile memory 20. At this time, the control unit 11 determines a storage location (storage address) of a code word in the non-volatile memory 20, and also instructs the memory I/F 13 of the determined storage location.

The ECC encoding unit 14a of the encoding unit 14 executes error correction encoding on the user data on the data buffer 12 based on the instruction from the control unit 11. Next, the error mitigation encoding unit 14b reads the user data after having been subjected to the error correction encoding from the data buffer 12, and executes error mitigation encoding on the read user data to generate a code word.

As an encoding scheme of the error correction code, for example, an encoding scheme using an algebraic code, such as a Bose-Chaudhuri-Hocquenghem (BCH) code and a Reed-Solomon (RS) code, and an encoding scheme using a code based on a sparse graph such as a low-density parity-check (LDPC) code can be employed. The memory I/F 13 performs control to store the code word in the storage location on the non-volatile memory 20 instructed from the control unit 11.

Next, a process at the time of reading from the non-volatile memory 20 of the present embodiment will be described. At the time of reading from the non-volatile memory 20, the control unit 11 designates an address on the non-volatile memory 20 to instruct the memory I/F 13 to perform reading. Further, the control unit 11 instructs the decoding unit 16 to start decoding. The memory I/F 13 reads reception word from the designated address of the non-volatile memory 20 according to the instruction of the control unit 11, and inputs the read reception word to the decoding unit 16. The ECC decoding unit 16a of the decoding unit 16 executes error correction decoding on the reception word read from the non-volatile memory 20. Thereafter, the error mitigation decoding unit 16b executes error mitigation decoding on the data that has been subjected to the error correction decoding.

Figure 2:
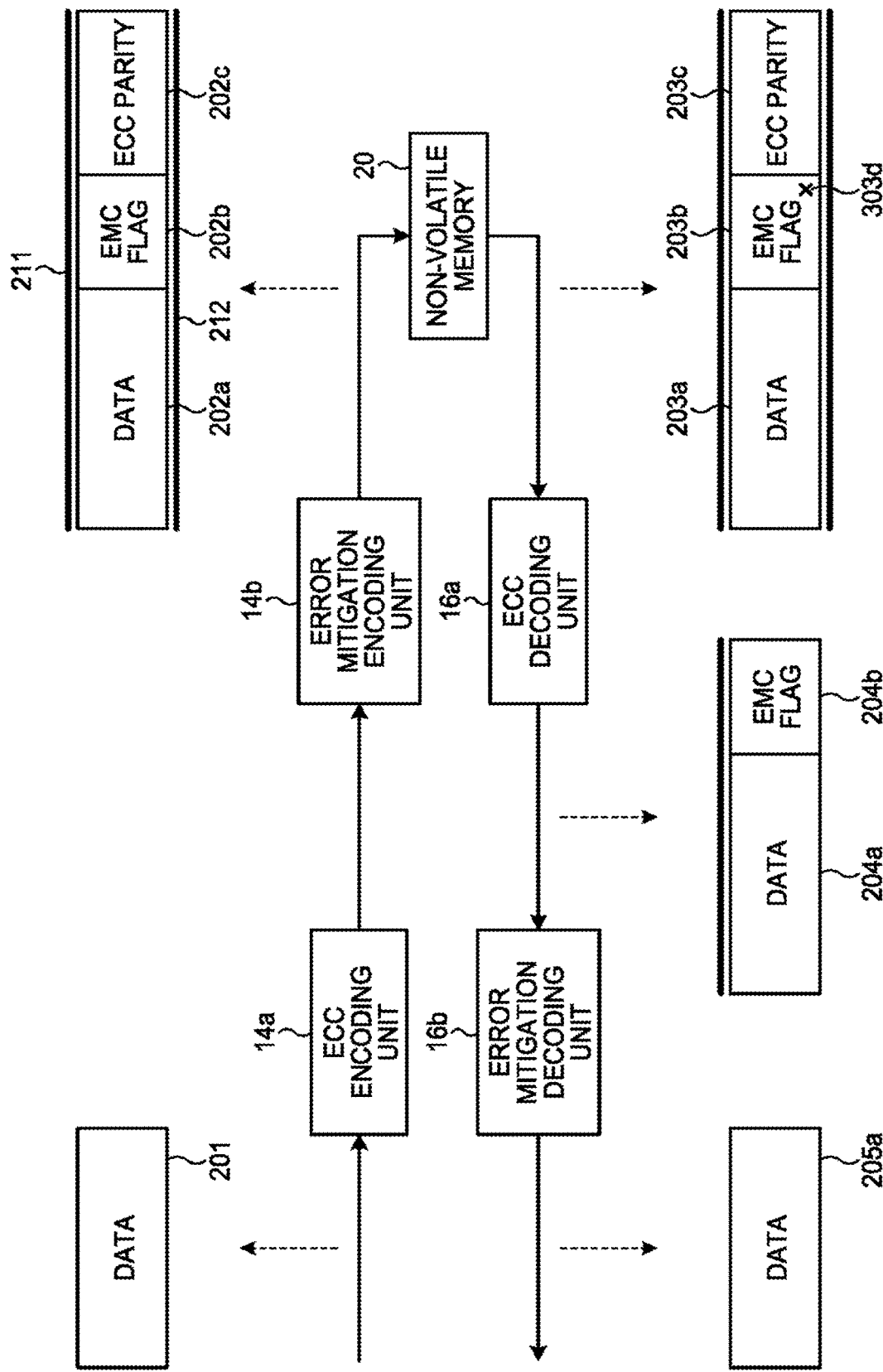
FIG. 2 is a diagram for describing flow of encoding and decoding by the memory system according to the first embodiment.

Next, flow of encoding and decoding by the memory system 1 of the present embodiment will be further described. FIG. 2 is a diagram for describing the flow of encoding and decoding by the memory system 1.

Data 201 to be encoded is first subjected to error correction encoding by the ECC encoding unit 14a. The data that has been subjected to the error correction encoding is subjected to error mitigation encoding by the error mitigation encoding unit 14b. Lines 211 and 212 in FIG. 2 indicate ranges protected by the error mitigation code and the error correction code, respectively. In this manner, according to the present embodiment, all of data 202a, an EMC flag 202b, and an ECC parity 202c are protected by both the error mitigation code and the error correction code. The non-volatile memory 20 stores the data protected in this manner.

At the time of decoding, the reception word read from the non-volatile memory 20 is passed to the FCC decoding unit 16a. The reception word includes data 203a, an EMC flag 203b, and an ECC parity 203c. A mart "x" 303d in FIG. 2 represents that an error is included in the EMI flag 203b.

In the present embodiment, error correction decoding is first executed on the reception word by the ECC decoding unit 16a. Data 204a and an EMC flag 204b represent data decoded by this error correction decoding. In this example, the error in the EMC flag 203b is corrected by the error correction decoding so that the EMC flag 204b containing no error is obtained. Further, both the data 204a and the EMC flag 204b are protected by the error mitigation code as illustrated in FIG. 2.

The error mitigation decoding unit 16b executes error mitigation decoding on the data 204a and the EMC flag 204b. Since the error included in the EMC flag 204b has been corrected, the error is not amplified. Data 205a is data obtained by the error mitigation decoding.

Figure 3:
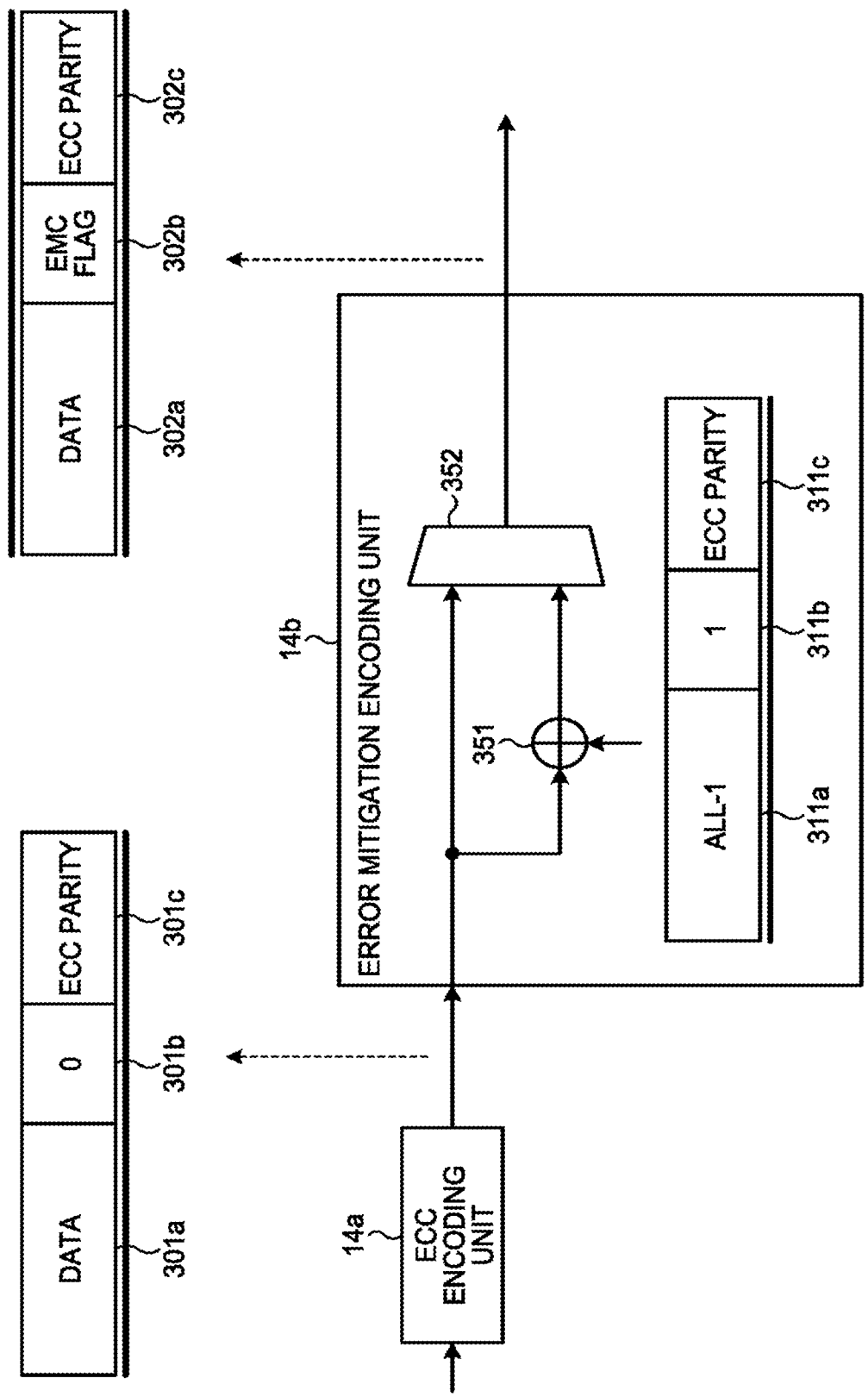
FIG. 3 is a block diagram illustrating an example of a detailed functional configuration of an error mitigation encoding unit of the first embodiment.
Figure 4:
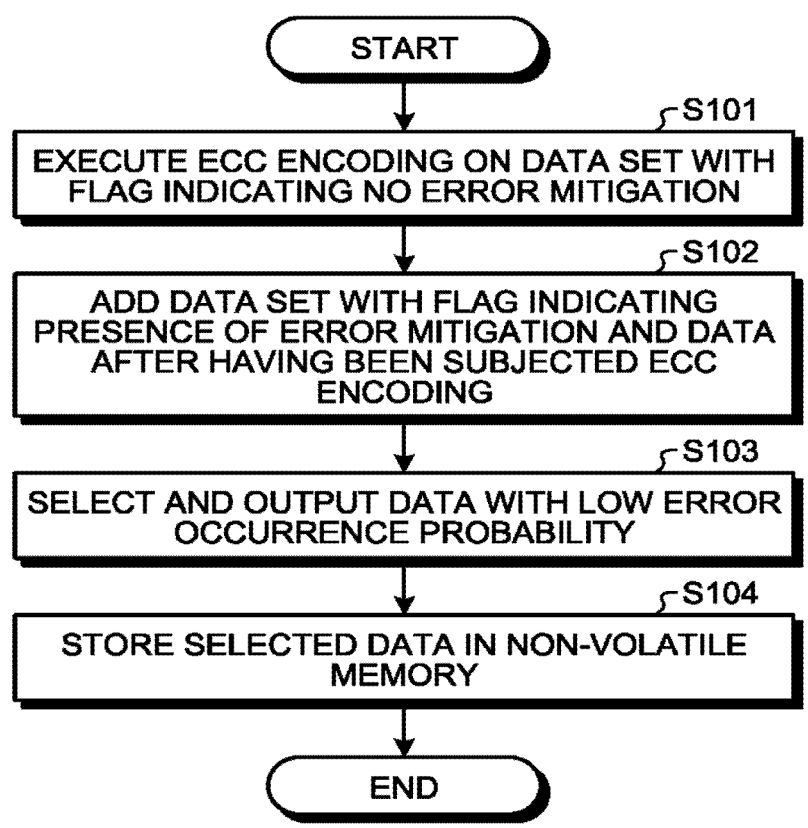
FIG. 4 is a flowchart illustrating an example of flow of an encoding process of the first embodiment.

A function to realize the encoding and decoding as illustrated in FIG. 2 will be described with reference to FIGS. 3 and 4. FIG. 3 is a block diagram illustrating an example of a detailed functional configuration of the error mitigation encoding unit 14b of the present embodiment. FIG. 4 is a flowchart illustrating an example of flow of an encoding process of the present embodiment.

The ECC encoding unit 14a performs error correction encoding on data 301a to be encoded targeting data with an EMC flag 301b in which a value indicating that the data is not to be converted by error mitigation encoding has been set (Step S101). When using the asymmetric coding, the ECC encoding unit 14a executes error correction encoding on the data 301a added with the END flag 301b in which "0" indicating that the data is not to be inverted has been set as illustrated in FIG. 3. As a result, the data added with the ECC parity 301c is output as encoded data (first encoded data) by the error correction encoding.

The ECC encoding unit 14a uses an error correction encoding scheme having linearity in common with the error mitigation encoding scheme employed by the error mitigation encoding unit 14b for a finite field of a predetermined order. For example, when using the asymmetric coding, the ECC encoding unit 14a uses an encoding scheme based on an LDPC code having linearity in a finite field of an order of two. The encoding scheme having the linearity in the finite field of the order of two is not limited to the LDPC code, and for example, a BCH code may be used. Incidentally, a finite field of an order of n will be sometimes described as GF(n) hereinafter. For example, the finite field of the order of two is represented as GF(2).

Further, data set as a unit of error correction encoding and error mitigation encoding will be referred to as a frame hereinafter. A size of a frame (frame size) of the error correction encoding and a frame size of the error mitigation encoding may be the same or different. In the present embodiment, a case where both the sizes are the same will be described.

The entire frame (the data 301a, the EMC flag 301b, and the ECC parity 301c) that has been subjected to the error correction encoding as described above by the ECC encoding unit 14a is protected with the error correction.

After the ECC encoding unit 14a executes the error correction encoding, the error mitigation encoding unit 14b executes error mitigation encoding on the frame after having been subjected to the error correction encoding. The error mitigation encoding unit 14b includes an addition unit 351 and a selection unit 352.

The addition unit 351 adds encoded data (second encoded data), obtained by executing error correction encoding on predetermined data, and the encoded data (first encoded data) after having been subjected to the error correction encoding obtained in Step S101 to output encoded data (third encoded data) that is an addition result (Step S102).

For example, the predetermined data is data including a value to invert a value of each bit included in encoded data when the encoded data obtained in Step S101 is added (for example, data in which all bits are "1", data 311a in FIG. 3). Further, the predetermined data includes a value indicating that data is to be converted by error mitigation encoding, for example, an EMC flag in which "1" is set to indicate that a bit is to be inverted (an EMC flag 311b in FIG. 3). The encoded data (second encoded data) obtained by executing the error correction encoding on the data set in this manner is data further including an ECC parity 311c.

In the example of FIG. 3, the addition unit 331 adds the data 311a in which all the bits are "1" to a data part (the data 301a) of the input frame. As a result, the bits of the data 301a are inverted. Further, the addition unit 351 adds the EMC flag 311b in which the bit having the value of "1" has been set, to the EMC flag 301b. The addition unit 351 adds the ECC parity 311c, calculated in advance with respect to the data 311a and the EMC flag 311b, to the ECC parity 301c. The addition is, for example, an exclusive OR for each bit. That is, the addition is an addition operation defined by GF(2).

The selection unit 352 selects and outputs any one of data (a frame) generated by the operation of the addition unit 351 and the original input frame (encoded data obtained in Step S101) (Step S103). For example, the selection unit 352 estimates an error occurrence probability of each frame, and selects and outputs a frame with a lower error occurrence probability. Although any method may be used as a method for estimating the error occurrence probability, for example, the following method can be applied.

(Estimation Method 1)

A frame in which the number of bit values (for example, "1") having a high error occurrence probability is smaller than the number of bit values (for example, "0") having a low error occurrence probability is selected as a frame with a low error occurrence probability.

(Estimation Method 2)

A frame with a fewer bit patterns each having a high error occurrence probability is selected as a frame with a low error occurrence probability. The bit pattern is, for example, a pattern of bits serving as a unit to be written to an MLC. For example, if the memory cell is a TLC, a 3-bit pattern corresponding to data to be written to each memory cell is a bit pattern. More specifically, there are eight bit patterns of "000", "001", "010", "011", "100", "101", "110", and "111". When an error occurrence probability for each bit pattern can be calculated, a sum of error occurrence probabilities of bit patterns included in each frame may be obtained, and a frame with the smaller sum may be selected a frame with a low error occurrence probability.

The memory I/F 13 stores the selected encoded data in the non-volatile memory 20 (Step S104).

As an example of a configuration in which the error mitigation code is used together with the error correction code, a method of using the error mitigation code is an outer code and a method of using the error mitigation code as an inner code are conceivable. The method of using the error mitigation code as the outer code is a method of performing error mitigation encoding and then error correction encoding at the time of encoding, and performing error correction decoding and then error mitigation decoding at the time of decoding. The method of using the error mitigation code as the inner code is a method of performing error correction encoding and then error mitigation encoding at the time of encoding, and performing error mitigation decoding and then error correction decoding at the time of decoding.

When the error mitigation code is used as the outer code, data is first subjected to error mitigation encoding. As a result, an error is generally mitigated in the data. Further, depending on the encoding method, it is possible to also mitigate an error of the EMC flag. The error-mitigated data is then subjected to error correction encoding. The ECC parity added at this time is not subjected to an error mitigation process, and thus, has a problem that an error is more likely to occur as compared with the data and the EMC flag.

When the error mitigation code is used as the inner code, the error mitigation process is executed on all of the data, the ECC parity, and the error mitigation code, and thus, error mitigation performance is higher as compared with the case of using the error mitigation code as the outer code. In the case of using the error mitigation code as the inner code, however, there arises a problem that the EMC flag is not protected by the error correction code. For example, error mitigation decoding is performed prior to error correction decoding, but, when an error occurs in the EMC flag, the error is amplified in the stage of the error mitigation decoding. Thus, there is a high possibility that the error correction decoding in the latter stage may fail.

On the other hand, in the present embodiment, even when the error correction code and the error mitigation code are used together, it is possible to suppress the occurrence of the above problems and to execute the error correction with higher accuracy.

That is, the memory system according to the present embodiment can estimate the error occurrence probability using all fields of the data, the EMC flag, and the ECC parity, and select and output the frame with the lower error occurrence probability. In other words, the effect of the error mitigation code is exerted to the entire frame in the present embodiment. Further, in the case of the original input frame (the encoded data obtained in Step S101) in which the output frame is not subjected to bit inversion, the input frame is protected with the error correction, and thus, output frame is protected with the error correction. Further, in the case where the frame in which the output frame has been subjected to bit inversion (the encoded data obtained by Step S102), the output frame is also a code word of the error correction code since data obtained by adding code words of linear codes on GF(2) to each other. That is, even if any frame is selected, the selected frame is in a state where the entire frame has been protected with the error correction.

As described above, the entire data sequence generated by performing the error correction encoding and the error mitigation encoding is protected with the error mitigation and the error correction according to the present embodiment. Since the entire data sequence is error-mitigated, it is possible to reduce errors occurring in the error mitigation code as compared with the case of using the error mitigation code as the outer code. Further, the error correction decoding is first executed at the time of decoding, and the error mitigation, decoding is executed after eliminating the entire error including the EMC flag. Thus, for example, the error amplification at the time of the error mitigation decoding that occurs in the case of using the error mitigation code as the inner code does not occur in the present embodiment.

(First Modification)

Figure 5:
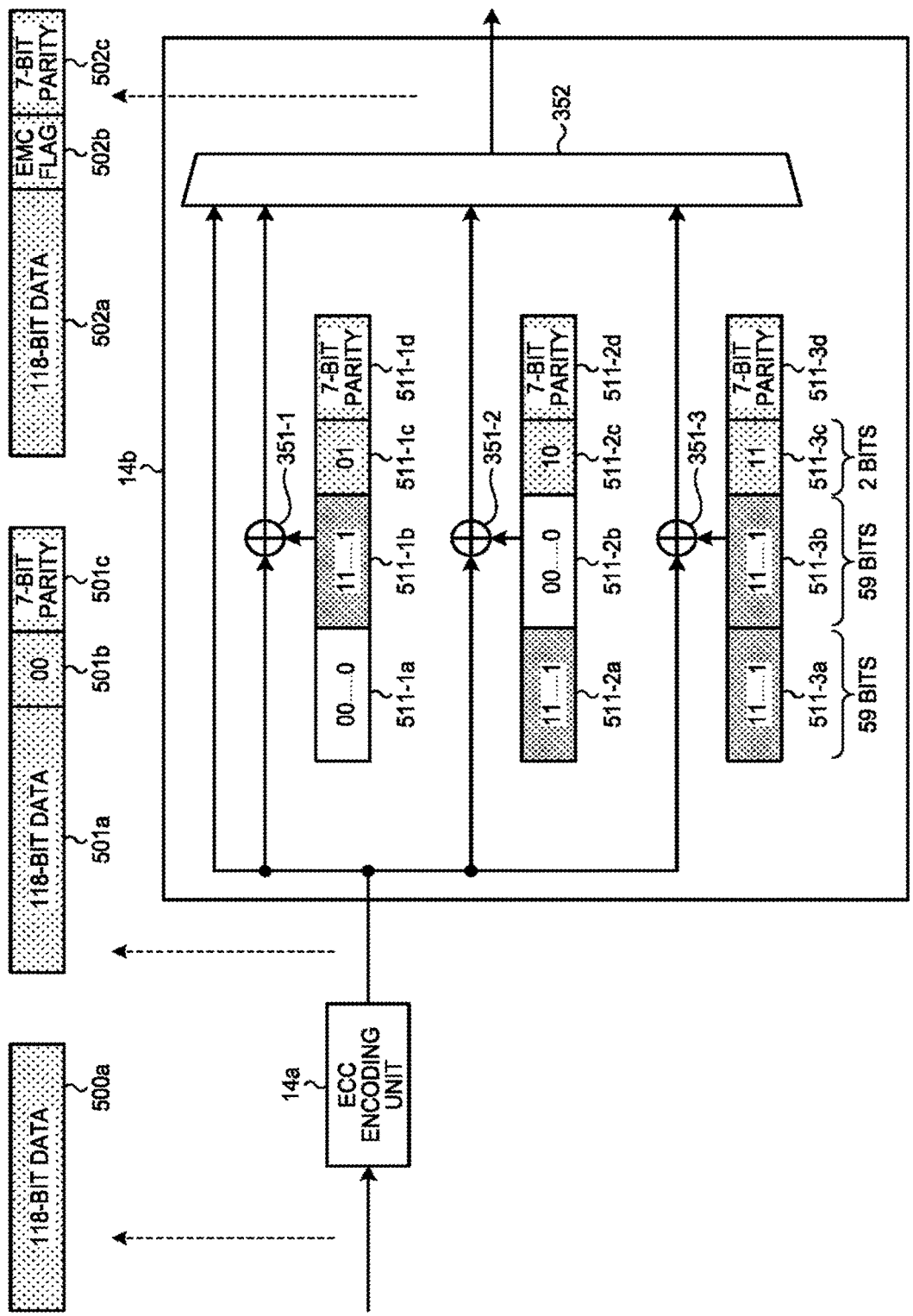
FIG. 5 is a block diagram illustrating an example of a detailed functional configuration of an error mitigation encoding unit according to a first modification.

Next, a case where the frame sizes of the error correction encoding and the error mitigation encoding are different from each other will be described. Hereinafter, a description will be given with an example in which a Hamming code with a frame size of 127 bits and an information length of 120 bits is employed as an error correction code and asymmetric coding with a frame size of 60 bits and an information length of 59 bits is employed as an error mitigation code. FIG. 5 is a block diagram illustrating an example of a detailed functional configuration of the error mitigation encoding unit 14b according to such a first modification. In the example of FIG. 5, two frames of the asymmetric coding (error mitigation code) correspond to one frame of the Hamming code (error correction code).

First, data 500a of 118 bits is input to the ECC encoding unit 14a. The ECC encoding unit 14a adds two "0" bits, as a field 501b of an ENC flag, to data 501a of 118 bits (the same as the data 500a) to make data of 120 bits. The ECC encoding unit 14a executes error correction encoding using the Hamming code on the 120-bit data, adds a parity bit 501c of 7 bits, and outputs a frame of 127 bits.

Next, the error mitigation encoding unit 14b adds the following three error correction code words prepared in advance to the 127-bit frame obtained by the ECC encoding unit 14a to generate four candidates of code words (code word candidates) combined with the original input frame. This addition operation is the addition on GF(2).

Code Word 1: A data part includes data 511-1a having a value "0" from the first to 59th bits and data 511-1b having a value "1" from the 60th to 112th bits. As an EMC flag 511-1c, "01" is set. This flag indicates that the first to 59th bits are not to be inverted, and the 60th to 118th bits are to be inverted. A parity bit according to the Hamming code with respect to the data part (the data 511-1a and the data 511-1b) and the EMC flag 511-1c is set as a parity bit 511-1d.

Code Word 2: A data part includes data 511-2a having a value "1" from the first to 59th bits and data 511-2b having a value "0" from the 60th to 118th bits. As an EMC flag 511-2c, "10" is set. This flag indicates that the first to 59th bits are to be inverted, and the 60th to 118th bits are not to be inverted. A parity bit according to the Hamming code with respect to the data part (the data 511-2a and the data 511-2b) and the EMC flag 511-2c is set as a parity bit 511-2d.

Code Word 3: A data part includes data 511-3a having a value "1" from the first to 59th bits and data 511-3b having a value "1" from the 60th to 118th bits. As an EMC flag 511-3c, "11" is set. This flag indicates that all the first to 59th bits and the 60th to 112th bits are to be inverted. A parity bit according to the Hamming code with respect to the data part (the data 511-3a and the data 511-3b) and the EMC flag 511-3c is set as a parity bit 511-3d.

The error mitigation encoding unit 14b of the present modification includes three addition units 351-1, 351-2, and 351-3. The addition units 351-1, 351-2, and 351-3 respectively add the above-described Code Words 1, 2, and 3 to the input frame (the data 501a, the field 501b of the EMC flag, and the parity bit 501c).

The selection unit 352 estimates an error occurrence probability for each of the four code word candidates generated in this manner, and selects and outputs a code word with a lower error occurrence probability. Data including the data 502a, the EMC flag 502b, and the parity bit 502c illustrated in FIG. 5 represents the code word selected in this manner.

Incidentally, the error mitigation decoding unit 16b can perform error mitigation decoding on the first to 59th bits and the 60th to 118th bits of the data part by referring to the first bit and the second bit of the EMC flag, respectively.

In this manner, according to the present modification, it is possible to realize the error mitigation protection and the error correction protection for the entire frame even if the frame size of the error correction encoding is different from the frame size of the error mitigation encoding.

Incidentally, the present modification has been described with the example in which one frame of the error correction encoding corresponds to two frames of the error mitigation encoding. The relationship of the frame size of each encoding is not limited thereto. In the case of using another frame size, it is sufficient to use the number of code word candidates according to a difference in frame size of each encoding.

(Second Modification)

Hereinbefore, the description has been given with the example of using the code having linearity in GF(2) such as LDPC, BCH, and asymmetric coding. The applicable finite field is not limited to GF(2), but the embodiment is also applicable to a finite field of an order other than two as long as both an error correction code and an error mitigation code have linearity for the same finite field.

Figure 6:
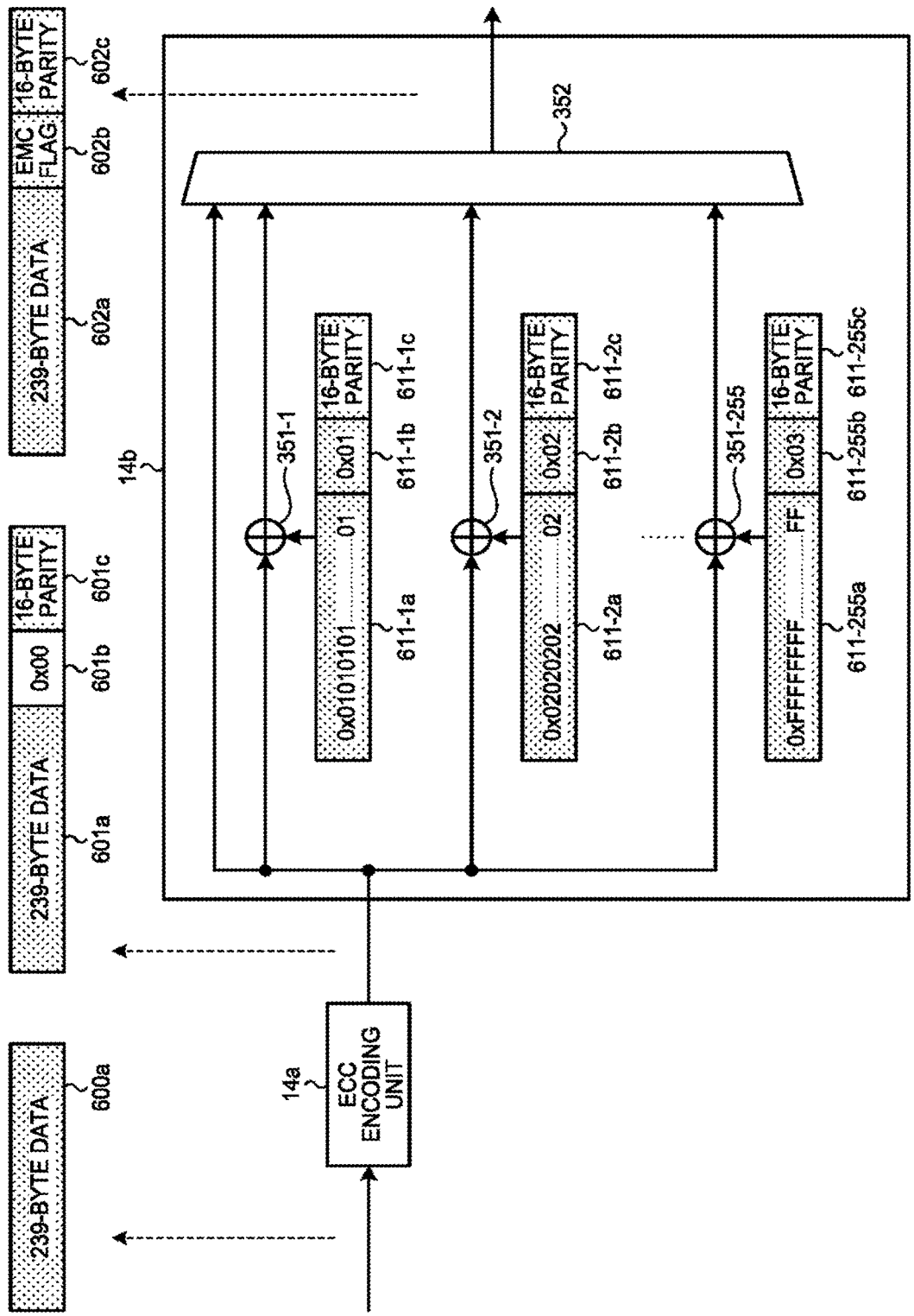
FIG. 6 is a block diagram illustrating an example of a detailed functional configuration of an error mitigation encoding unit according to a second modification.

Hereinafter, a description will be given regarding a modification in the case of using an RS code with a frame size of 256 bytes and an information length of 240 bytes, which has linearity in GF($2^8$), for error correction encoding. FIG. 6 is a block diagram illustrating an example of a detailed functional configuration of the error mitigation encoding unit 14b according to such a second modification.

First, data 600a of 239 bytes is input to the ECC encoding unit 14a. The ECC encoding unit 14a adds one "0" byte, as a field 601b of an EMC flag, to data 601a of 239 bytes (the same as the data 600a) to make data of 240 bytes. The ECC encoding unit 14a executes RS encoding on the 240-byte data, adds an RS code parity 601c of 16 bytes, and outputs a frame of 256 bytes.

Next, the error mitigation encoding unit 14b adds each of 255 error correction code words prepared in advance to the 256-byte frame obtained by the ECC encoding unit 14a to generate 256 code word candidates combined with the original input frame. This addition operation is the addition on GF($2^8$).

The 255 error correction code words excluding the original input frame are data in which values of bytes are 1 to 255 (0x01 to 0xFF in hexadecimal), respectively, the value is repeated 240 times, and an RS code parity of 16 bytes is added to each value.

For example, data 611-1a in FIG. 6 is data of 239 bytes in which a value of each byte is "1". An EMC flag 611-1b is an EMC flag in which a value of each byte is "1". As an RS code parity 611-1c, an RS code parity with respect to the data 611-1a and the EMC flag 611-1b is set. In the same manner, an error correction code word including data 611-2a and an EMC flag 611-2b in which a value of each byte is "2", and an RS code parity 611-2c for these pieces of data is prepared. Further, an error correction code word including data 611-255a and an EMC flag 611-255b in which a value of each byte is "255", and an RS code parity 611-255c for these pieces of data is prepared.

The error mitigation encoding unit 14b of the present modification includes 255 addition units 351-1 to 351-255. Each of the addition units 351-1 to 351-255 adds one corresponding error correction code word out of the 255 error correction code words to the input frame (the data 601a, the field 601b of the EMC flag, and the RS code parity 601c).

The selection unit 352 estimates an error occurrence probability for each of the 256 code word candidates generated in this manner, and selects and outputs a code word with a lower error occurrence probability. Data including the data 602a, the EMC flag 602b, and the RS code parity 602c illustrated in FIG. 6 represents the code word selected in this manner.

In this manner, it is possible to use various error correction codes such as the RS code as well as the encoding scheme having linearity in GF(2) by employing the error mitigation code in accordance with the finite field in which the error correction code has linearity according to the present modification.

(Third Modification)

Hereinbefore, the example in which the asymmetric coding is used as the error mitigation code has been described. The applicable error mitigation code is not limited to the asymmetric coding, and any error mitigation code may be used as long as the error mitigation code has linearity in a finite field common to the error correction code to be used. For example, an error mitigation code using a guided scrambling scheme may be used.

In the scheme, for example, a random value (pseudo-random number) generated using a seed is set as a data part, and a plurality of error correction code words obtained by error correction encoding of data in which the seed is set as an EMC flag are prepared using a plurality of the seeds. The error mitigation encoding unit 14b adds each of the plurality of error correction code words to data, which has been subjected to the error correction encoding, (input frame) obtained by the ECC encoding unit 14a. The selection unit 552 selects and outputs a code word candidate having a lower error occurrence probability from among the plurality of code word candidates combined with the input frame.

Second Embodiment

An error correction code has a property that correction capability increases as a frame size increases. Thus, there is a case where an error correction code with a large frame size is used. Meanwhile, as an error mitigation code encoding scheme, like the asymmetric coding and the guided scrambling scheme described above, there is a scheme in which error occurrence probabilities of plurality of code word candidates are estimated, and a code word estimated to have a lower error occurrence probability is selected.

When such an error mitigation code is encoded according to the configuration of the first modification described above while keeping an encoding rate at a desired value, the number of code word candidates increases exponentially so that an operation scale increases. For example, the frame size of the error correction encoding is twice the frame size of the error mitigation encoding in the first modification, and thus, the number of code word candidates is $2^2=4$. Meanwhile, for example, the number of EMC flags is 10 bits when assuming that a frame size of the error correction code is 1 k bits and an encoding rate of the error mitigation code is 0.99. That is, the number of code word candidates becomes $2^{10}=1024$, and the operation scale for the addition and selection increases.

Therefore, in the present embodiment, an error correction encoding scheme using a plurality of error correction codes is employed, and the scheme of the first embodiment (or the modification) is applied to one of the plurality of the error correction codes (the error correction code to be applied first). As a result, it is possible to realize the error mitigation encoding for parities of the error correction codes without increasing the operation scale even when the frame size of the error correction encoding is large. Examples of the error correction encoding scheme using the plurality of error correction codes include a multi-dimensional error correction code and a concatenated code.

The multi-dimensional error correction code indicates a scheme in which a symbol, which is at least one or more constituent units of an error correction code, is multiply protected by a plurality of smaller component codes. Further, one symbol is formed of, for example, one bit (an element of a binary filed) or an element of an alphabet such as a finite field other than the binary field.

An example of a two-dimensional error correction code is a product code. The product code has a structure in which each information bit (which may be a symbol) as a constituent unit of a code word is protected by an error correction code in each of a row direction and a column direction.

The concatenated code refers to a scheme in which data encoded with a certain error correction code (an outer code or a first error correction code) is further subjected to encoding with another error correction code (an inner code or a second error correction code).

Figure 7:
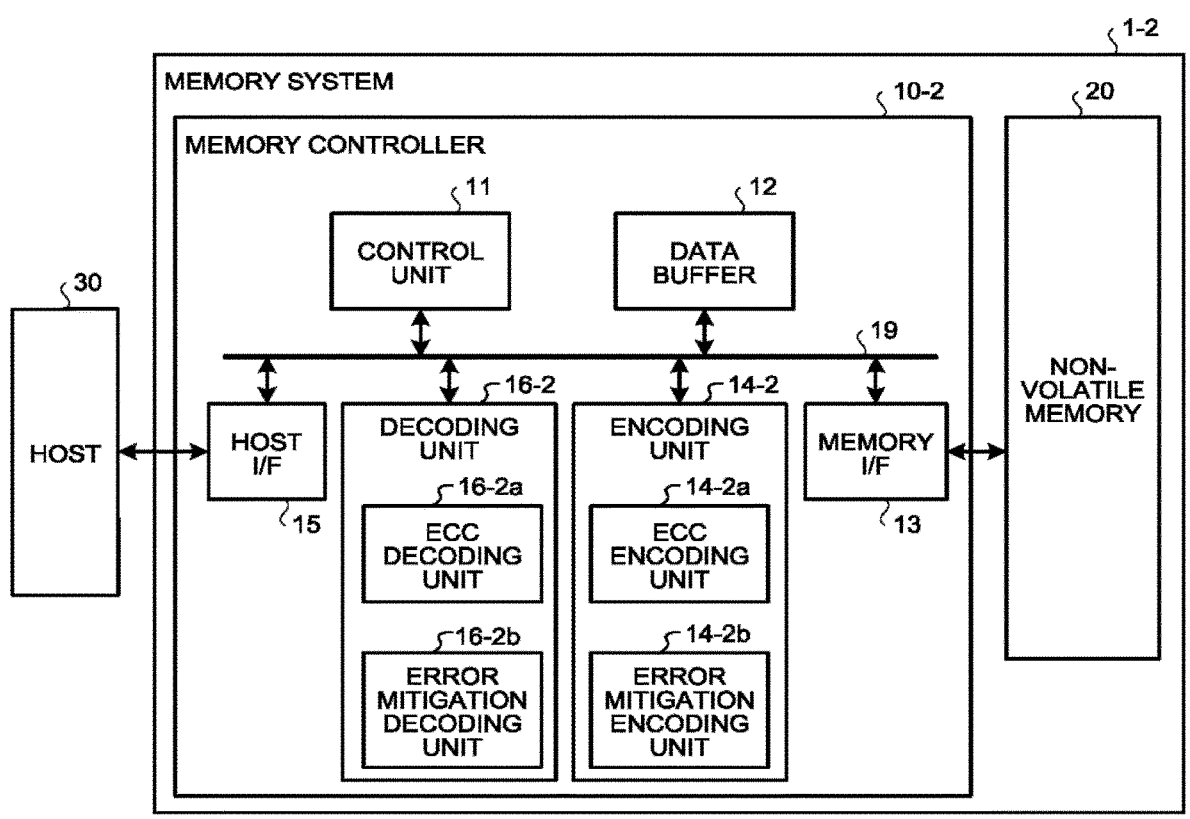
FIG. 7 is a block diagram illustrating a schematic configuration example of a memory system according to a second embodiment.

Hereinafter, a description will be given by exemplifying the case of using the product code. FIG. 7 is a block diagram illustrating a schematic configuration example of a memory system according to a second embodiment; and As illustrated in FIG. 7, a memory system 1-2 of the present embodiment includes a memory controller 10-2 and the non-volatile memory 20. The present embodiment s different from the first embodiment in terms of configurations of an encoding unit 14-2 in the memory controller 10-2 (an ECC encoding unit 14-2a and an error mitigation encoding unit 14-2b) and a decoding unit 16-2 (an ECC decoding unit 16-2a and an error mitigation decoding unit 16-2b). The other configurations are the same as those of the first embodiment, and thus, will be denoted by the same reference signs and descriptions thereof will be omitted.

The ECC encoding unit 14-2a is different from the ECC encoding unit 14a of the first embodiment in terms that error correction encoding is performed using the product code. The error mitigation encoding unit 14-2b is different from the error mitigation encoding unit 14b of the first embodiment in terms of performing error mitigation encoding on encoded data obtained by error correction encoding in a direction (for example, the row direction) executed first out of error correction encoding in the row direction and error correction encoding in the column direction.

The ECC decoding unit 16-2a is different from the ECC decoding unit 16a of the first embodiment in terms of performing error correction decoding of the product code. The error mitigation decoding unit 16-2b is different from the error mitigation decoding unit 16b of the first embodiment in terms of executing error mitigation decoding on the encoded data in a direction of the error mitigation encoding performed by the error mitigation encoding unit 14-2b.

FIG. 8 is a diagram for describing flow of an encoding process in the case of employing a BCH product code as an error correction code and employing asymmetric coding as an error mitigation code. Encoding with the BCH product code is an encoding scheme in which original data is arrayed in two dimensions, BCH encoding is performed in a row direction to give a row parity, and then, BCH encoding is performed in a column direction to give a column parity.

For example, the ECC encoding unit 14-2a arrays input data 800a in two dimensions, executes BCH encoding in the row direction first on data including two-dimensionally arrayed data 801a (the same as the data 800a) and an EMC flag 601b in which a value "0" indicating that a bit is not to be inverted has been set, and then, calculates a row parity 801c.

Next, the error mitigation encoding unit 14-2b executes the error mitigation encoding of the first embodiment (or the modification) for each row of the encoded data after having been subjected to the error correction encoding. Data 802a, an EMC flag 802b, and a row parity 802c represent encoded data output by the error mitigation encoding.

Next, the ECC encoding unit 14-2a executes BCH encoding in the column direction on the encoded data output by the error mitigation encoding. Data 803a, an ENC flag 803b, a row parity 803c, a column parity 803d, a parity 803e of the EMC flag, and a column parity 803f of the row parity represent encoded data output by the BCH encoding in the column direction.

In this manner, protection with the error mitigation code can be obtained even for the row parity by the BCH code according to the present embodiment. Although the protection with the error mitigation code is not obtained for the column parity by the BCH code, it is possible to ensure high reliability since a frame size of the error correction cede is large. Further, it is possible to execute the error mitigation encoding for each row of the data arrayed in two dimensions even when the frame size is large. Thus, it is possible to avoid an excessive increase in the number of code word candidates and to suppress an increase in operation scale.

Incidentally, the BCH product code may be configured such that a parity is first given in the column direction, and then, a parity is given in the row direction. In this case, the error mitigation encoding may be performed after the BCH encoding in the column direction in which the parity is first given and before the BCH encoding in the row direction.

Further, a component code constituting the product code is not limited to the BCH code, but any code may be used. For example, the LDPC and the RS code (of the second modification) may be used.

Further, in the case of applying the concatenated code, data encoded using an outer code may be subjected to error mitigation encoding, and then, subjected to encoding using an inner code. Error correction codes used for the outer code and the inner code may employ any code.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory system connectable a host, the memory system comprising:
   a non-volatile memory; and
   a memory controller implemented by one or more hardware processors and configured to:
   execute error correction encoding on user data received from the host to generate first encoded data,
   add the first encoded data to each of one or more pieces of second encoded data to generate one or more pieces of third encoded data obtained by executing error mitigation encoding on the first encoded data, the second encoded data being obtained by performing the error correction encoding on each of one or more pieces of predetermined data,
   select any one piece of encoded data from the first encoded data and the one or more pieces of third encoded data, and
   store the selected encoded data to the non-volatile memory.

2. The memory system according to claim 1, wherein the memory controller is configured to select one piece of encoded data estimated to have a lower error occurrence probability than an error occurrence probability of other encoded data from the first encoded data and the one or more pieces of third encoded data.

3. The memory system according to claim 1, wherein the error correction encoding and the error mitigation encoding have linearity in a finite field of a predetermined order.

4. The memory system according to claim 1, wherein
   the error correction encoding is encoding to generate a multi-dimensional error correction code in which at least one symbol out of symbols constituting a code is protected by at least a first component code and a second component code different from the first component code, and
   the first encoded data is the first component code.

5. The memory system according to claim 1, wherein the first encoded data is a first error correction code out of the first error correction code and a second error correction code that constitute a concatenated code.

6. The memory system according to claim 1, wherein a size of data set as a unit of the error correction encoding is identical to a size of data set as a unit of the error mitigation encoding.

7. The memory system according to claim 1, wherein
   a first size, which is a size of data set as a unit of the error correction encoding, is different from a second size, which is a size of data set as a unit of the error mitigation encoding, and
   the memory controller is configured to add the first encoded data to each of a plurality of pieces of the second encoded data to generate a plurality of pieces of the third encoded data, the number of the pieces of second encoded data according to a difference between the first size and the second size.

8. The memory system according to claim 1, wherein the predetermined data includes a value to inverts a value of each bit included in the first encoded data when the first encoded data is added.

9. The memory system according to claim 1, wherein the predetermined data includes a randomly generated value.

10. The memory system according to claim 1, wherein the memory controller is configured to execute error correction decoding on the encoded data read from the non-volatile memory, and execute error mitigation decoding on a decoding result of the error correction decoding.

11. A method of controlling a non-volatile memory comprising:
    executing error correction encoding on user data received from a host to generate first encoded data;
    generating one or more pieces of third encoded data by adding the first encoded data to each of one or more pieces of second encoded data, the second encoded data being obtained by executing the error correction encoding on each of one or more pieces of predetermined data;
    selecting any one piece of encoded data from the first encoded data and the one or more pieces of third encoded data; and
    storing the selected encoded data in the non-volatile memory.

12. The method according to claim 11, wherein the selecting includes selecting one piece of encoded data estimated to have a lower error occurrence probability than an error occurrence probability of other encoded data from the first encoded data and the one or more pieces of third encoded data.

13. The method according to claim 11, wherein the error correction encoding and the error mitigation encoding have linearity in a finite field of a predetermined order.

14. The method according to claim 11, wherein
    the error correction encoding is encoding to generate a multi-dimensional error correction code in which at least one symbol out of symbols constituting a code is protected by at least a first component code and a second component code different from the first component code, and the first encoded data is the first component code.

15. The method according to claim 11, wherein the first encoded data is a first error correction code out of the first error correction code and a second error correction code that constitute a concatenated code.

16. The method according to claim 11, wherein a size of data set as a unit of the error correction encoding is identical to a size of data set as a unit of the error mitigation encoding.

17. The method according to claim 11, wherein a first size, which is a size of data set as a unit of the error correction encoding, is different from a second size, which is a size of data set as a unit of the error mitigation encoding, and the generating of the one or more pieces of third encoded data includes generating a plurality of pieces of the third encoded data by adding the first encoded data to each of a plurality of pieces of the second encoded data, the number of the pieces of second encoded data according to a difference between the first size and the second size.

18. The method according to claim 11, wherein the predetermined data includes a value to inverts a value of each bit included in the first encoded data when the first encoded data is added.

19. The method according to claim 11, wherein the predetermined data includes a randomly generated value.

20. The method according to claim 11, further comprising:

executing error correction decoding on the encoded data read from the non-volatile memory; and executing error mitigation decoding on a decoding result of the error correction decoding.

* * * * *